United States Patent [19]
Watanabe et al.

[11] Patent Number: 5,397,212
[45] Date of Patent: Mar. 14, 1995

[54] ROBOT WITH DUST-FREE AND MAINTENANCE-FREE ACTUATORS

[75] Inventors: Katsuhide Watanabe, Fujisawa; Yoichi Kanemitsu, Chigasaki; Hiroyuki Shinozaki, Fujisawa; Naoji Hiraki; Shinichi Moriyama, both of Iizuka, all of Japan

[73] Assignee: Ebara Corporation, Tokyo, Japan

[21] Appl. No.: 19,678

[22] Filed: Feb. 19, 1993

[30] Foreign Application Priority Data

Feb. 21, 1992 [JP] Japan ................. 4-072239

[51] Int. Cl.[6] .......................... B25J 18/04
[52] U.S. Cl. ................. 414/744.6; 414/751; 901/17; 901/23; 310/90.5
[58] Field of Search ......... 414/751, 749, 744.1–744.4, 414/744.6, 3; 901/17, 19, 23, 24, 45, 16; 310/90.5; 294/86.41

[56] References Cited

U.S. PATENT DOCUMENTS

| | | | |
|---|---|---|---|
| 3,007,097 | 10/1961 | Shelley et al. | 901/17 X |
| 4,884,329 | 12/1989 | Higuchi | 901/45 X |
| 4,998,859 | 3/1991 | Oshima et al. | 414/751 X |
| 5,114,302 | 5/1992 | Meisser et al. | 901/16 X |
| 5,160,877 | 11/1992 | Fujiwara et al. | 310/90.5 X |

FOREIGN PATENT DOCUMENTS

| | | |
|---|---|---|
| 61-257828 | 11/1986 | Japan . |
| 63-139844 | 6/1988 | Japan . |
| 63-174895 | 7/1988 | Japan . |
| 63-242161 | 10/1988 | Japan . |
| 63-296235 | 12/1988 | Japan . |
| 1-103848 | 4/1989 | Japan . |
| 1-316191 | 12/1989 | Japan . |
| 2-97268 | 4/1990 | Japan . |
| 3-223021 | 10/1991 | Japan . |
| 4-65853 | 3/1992 | Japan . |
| 4-212435 | 8/1992 | Japan . |

*Primary Examiner*—Donald W. Underwood
*Attorney, Agent, or Firm*—Oblon, Spivak, McClelland, Maier, & Neustadt

[57] ABSTRACT

A robot with no mechanically contacting components are suitable for use in special environments such as semiconductor manufacturing processes where dust and lubrication are matters of important concern. The robot has a linear actuator composed of magnetic bearings and a linear motor for moving a robot arm linearly without mechanical contact, and a rotary actuator composed of magnetic bearings and a rotary motor for rotating a body which supports the linear actuator, around the rotary actuator without mechanical contact.

6 Claims, 12 Drawing Sheets

ROBOT WITH DUST-FREE AND MAINTENANCE-FREE ACTUATORS

BACKGROUND OF THE INVENTION

1. Field of the Invention

The present invention relates to a robot, and more particularly to a robot that can be used in special environments including space, vacuums, clean rooms, and liquids where dust and lubrication are matters of important concern.

2. Description of the Prior Art

In special environments including space, vacuums, clean rooms, and liquids, dust particles produced by contact elements of actuators tend to cause problems, and bearings of such actuators need to be lubricated. One example of such a special environment is in the semiconductor manufacturing industries. Specifically, efforts to achieve higher levels of large scale integration in semiconductor devices result in demands for higher dust control standards in semiconductor manufacturing environments and equipment. One attempt to meet such demands is to make the semiconductor manufacturing processes as automatic as possible using robots. The robots thus used in the semiconductor manufacturing systems produce dust particles and require maintenance of lubricated parts.

More specifically, as is well known in the art, the semiconductor manufacturing processes employ clean rooms for maintaining high levels of dust, temperature, and humidity control. Robots for use in such clean rooms should meet certain requirements with regard to dust control and operation reliability among others. For example, the robots should be equipped with a low-dust or dust-free mechanism for reducing or eliminating elements which would otherwise produce an undesirable amount of dust particles, or with a dust-prevention mechanism for preventing dust particles from flowing out of the robots and from being scattered around. The robots should also be highly reliable so that they will be maintenance-free.

Specific arrangements that are effective to meet the above requirements are as follows. A negative pressure is developed in the robot to cause air to flow from outside into the robot at all times for thereby preventing dust particles from flowing through any openings of the robot. The inner space of the robot is completely separated from the outer environment by magnetic fluid seals to prevent dust particles from being scattered out of the robot. Brushless AC servomotors are employed as actuators in the robot because the brushless AC servomotors generate less dust than DC servomotors and are maintenance-free.

SUMMARY OF THE INVENTION

It is therefore an object of the present invention to provide a robot which is dust-free and lubrication-free, can position workpieces with high accuracy, and can be used in special environments without dust and maintenance problems.

According to the present invention, there is provided a robot comprising a robot arm having a hand for carrying a workpiece, a linear actuator composed of magnetic bearings and a linear motor for moving the robot arm linearly without mechanical contact, and a rotary actuator composed of magnetic bearings and a rotary motor for rotating a body which supports the linear actuator, around the rotary actuator without mechanical contact.

Since the linear actuator for moving the robot arm linearly without mechanical contact is composed of the magnetic bearings and the linear motor, the linear actuator has no mechanically contacting components. Similarly, since the rotary actuator for rotating the body around the rotary actuator without mechanical contact is composed of the magnetic bearings and the rotary motor, the rotary actuator has no mechanically contacting components either. Consequently, the robot does not produce dust particles which would otherwise be generated by mechanically contact components. The robot is not required to be lubricated, does not contaminate the environment in which it is used, and can highly accurately position a workpiece carried by the hand. The robot is thus suitable for use in special environments such as highly clean space.

BRIEF DESCRIPTION OF THE DRAWINGS

The above and other objects, features, and advantages of the present invention will become apparent from the following description when taken in conjunction with the accompanying drawings which illustrate preferred embodiments of the present invention by way of example in which.

DETAILED DESCRIPTION OF THE PREFERRED EMBODIMENTS

Figure 1:
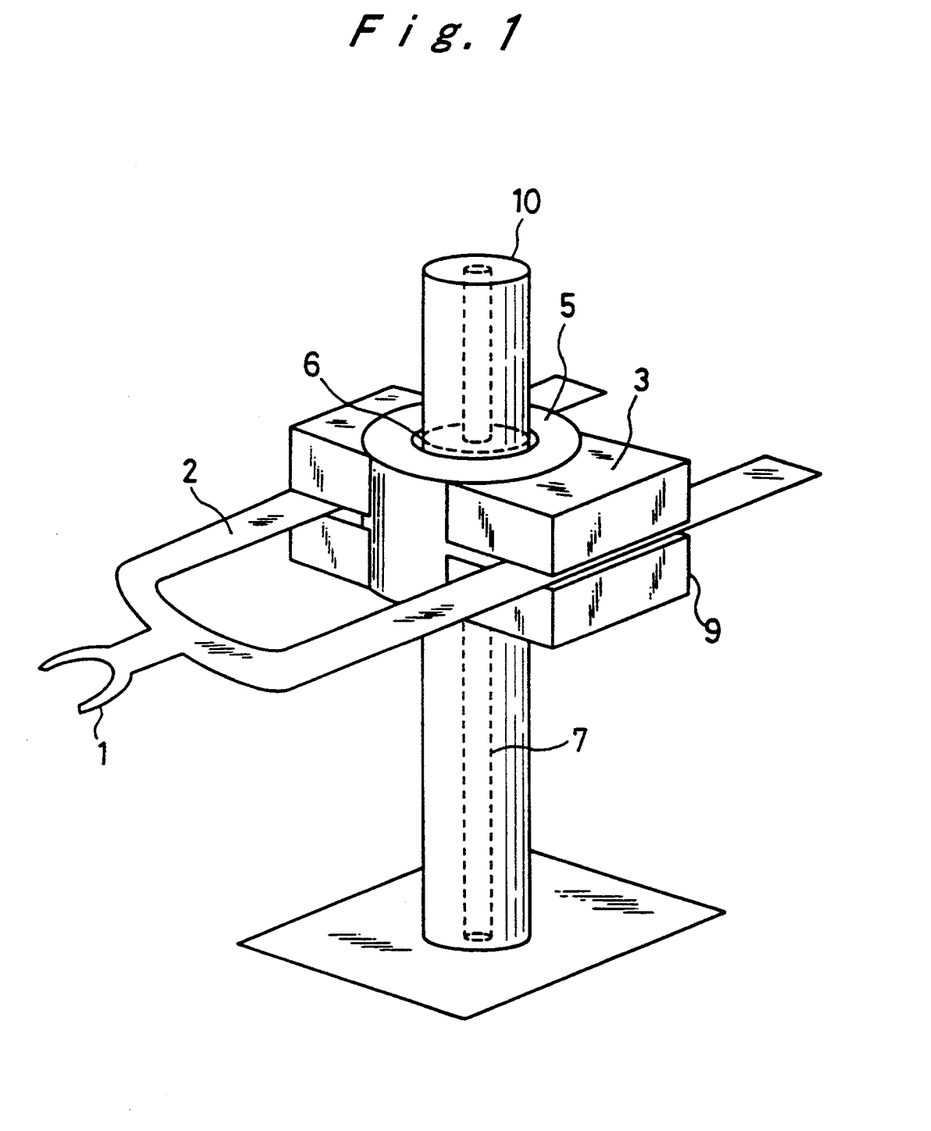
FIG. 1 is a perspective view of a robot according to an embodiment of the present invention.

As shown in FIG. 1, a robot according to an embodiment of the present invention has a bifurcated robot arm 2 with a hand 1 on its distal end for carrying a workpiece such as a semiconductor wafer or the like. The robot arm 2 is linearly actuatable in a horizontal plane by a linear actuator 3 that comprises magnetic bearings and a linear pulse motor. The magnetic bearings magnetically hold the robot arm 2 out of mechanical contact with the linear actuator 3. The linear actuator 3 is fixedly supported on a body, namely an outer rotor 5, which is rotatable in a horizontal plane by a rotary actuator 6 that comprises magnetic bearings and a rotary stepping motor. The magnetic bearings magnetically hold the outer rotor 5 out of mechanical contact with the rotary actuator 6. The rotary actuator 6 is vertically actuatable by a vertical actuator 7 that comprises a vertical feed screw assembly. Therefore, the semiconductor wafer or the like that is carried by the hand 1 is movable third-dimensionally or with three degrees of freedom, i.e., in linear and angular horizontal directions and a vertical direction.

The magnetic bearings and the linear pulse motor of the linear actuator 3 are composed of electromagnets or combinations of permanent-magnets and electromagnets. The magnets and their wires are hermetically enclosed in a box-like casing 9 supported on the outer rotor 5, and hence are not exposed to a surrounding special environment such as an ambient space which is cleaned to a high degree. Similarly, the feed screw assembly of the vertical actuator 7 and the magnetic bearings and stepping motor of the rotary actuator 6 are hermetically enclosed in a vertical cylindrical casing 10. Therefore, as the magnetic bearings and the rotary motor of the rotary actuator 6 are composed of electromagnets or combinations of permanent-magnets and electromagnets, the magnets and their wires of the rotary actuator 6 are not exposed to the surrounding special environment. Consequently, the surrounding environment is protected from contamination which would otherwise be caused by a gas produced by the electromagnets and their wires housed in the casings 9, 10. The bifurcated robot arm 2 has two arm members extending through the casing 9 one on each side of the rotary actuator 6.

Figure 2:
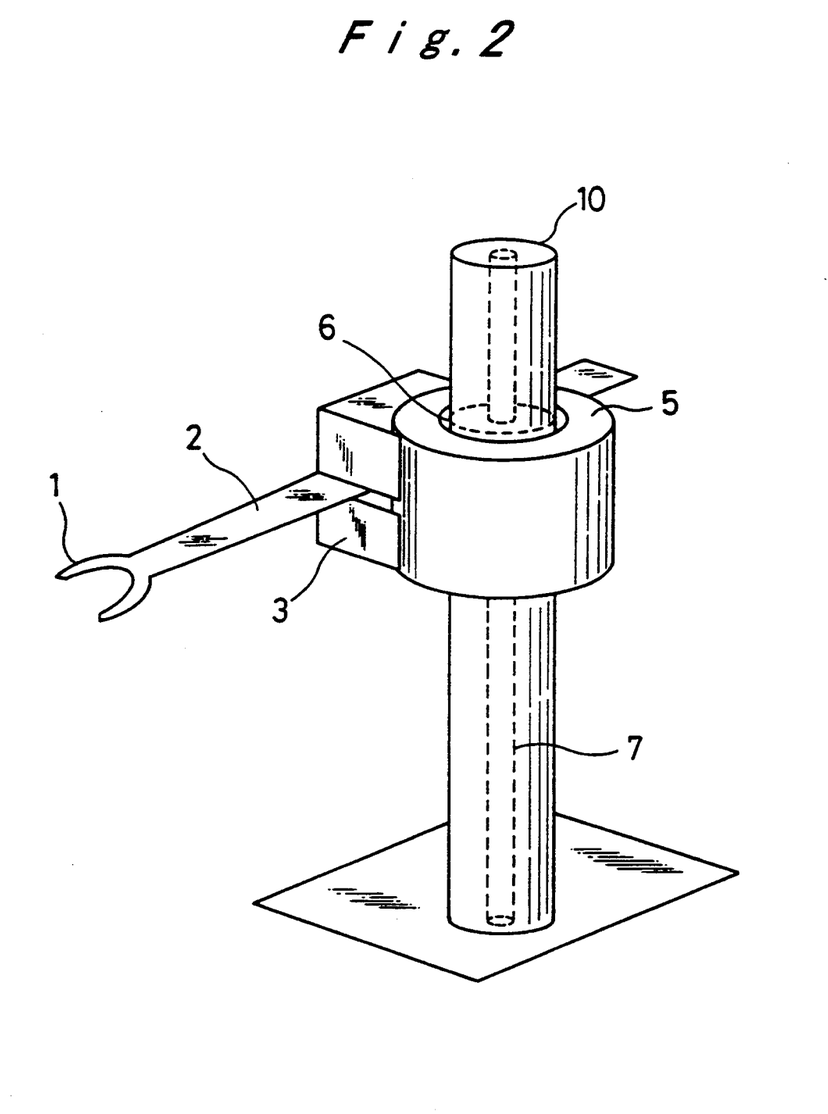
FIG. 2 is a perspective view of a robot according to another embodiment of the present invention.

FIG. 2 shows a robot according to another embodiment of the present invention. The robot shown in FIG. 2 differs from the robot shown in FIG. 1 in that a robot arm 2 is positioned on only one side of the rotary actuator 6. Since the robot arm 2 is positioned on only one side of the rotary actuator 6, the robot arm 2 is lightweight, reducing the load on rotary actuator 6.

Figure 3:
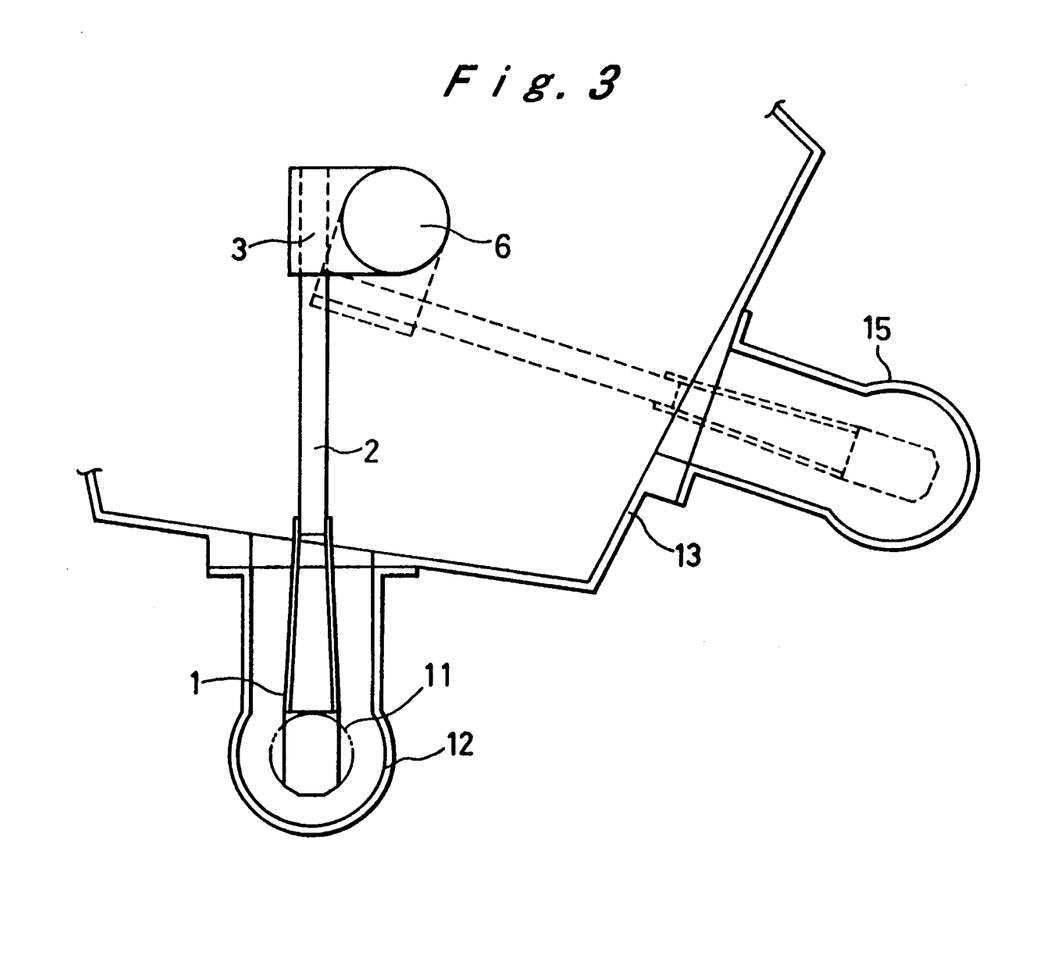
FIG. 3 is a view showing the manner in which the robot shown in FIG. 2 operates.

FIG. 3 shows the manner in which the robot shown in FIG. 2 operates. The robot is located in a pentagonal chamber 13 which is highly evacuated to provide a clean space therein. In operation, the robot draws a semiconductor wafer 11 from a CVD (chemical vapor deposition) chamber 12 of a semiconductor manufacturing system coupled to the pentagonal chamber 13, and carries the semiconductor wafer 11 into a feed port 15 that is also connected to the pentagonal chamber 13 in spaced relationship to the CVD chamber 12.

The operation of the robot will be described in greater detail below.

First, the linear actuator 3 horizontally pulls the robot arm 2 with the hand 1 carrying the semiconductor wafer 11. The semiconductor wafer 11 now moves from the CVD chamber 12 into the pentagonal chamber 13. When the center of gravity of the robot arm 2 enters the linear actuator 3, the rotary actuator 6 is rotated to turn the robot arm 2 until the semiconductor wafer 11 reaches a position in front of the feed port 15. Since the robot arm 2 is turned with its center of gravity positioned in the linear actuator 3, the robot arm 2 is well balanced, reducing the load on the rotary actuator 6. Then, the linear actuator 3 extends the robot arm 2 horizontally, moving the semiconductor wafer 11 into a central position in the feed port 15. Thereafter, the vertical actuator 7 (see FIG. 2) is driven to lower the robot arm 2 until the semiconductor wafer 11 is transferred from the hand 1 to a processing device (not shown) through the feed port 15.

Subsequently, the robot arm 2 is horizontally retracted into the pentagonal chamber 13 by the linear actuator 3, and then turned into a position in front of the CVD chamber 12 by the rotary actuator 6. Then, the robot arm 2 is horizontally extended into the CVD chamber 12 by the linear actuator 3 until the hand 1 is positioned beneath a next semiconductor wafer 11 in the CVD chamber 12. The vertical actuator 7 is driven to elevate the robot arm 2 until the next semiconductor wafer 11 is placed on the hand 1. One cycle of operation of the robot for feeding a semiconductor wafer 11 is now completed.

Figures 4A, 4B, 4C, 4D:
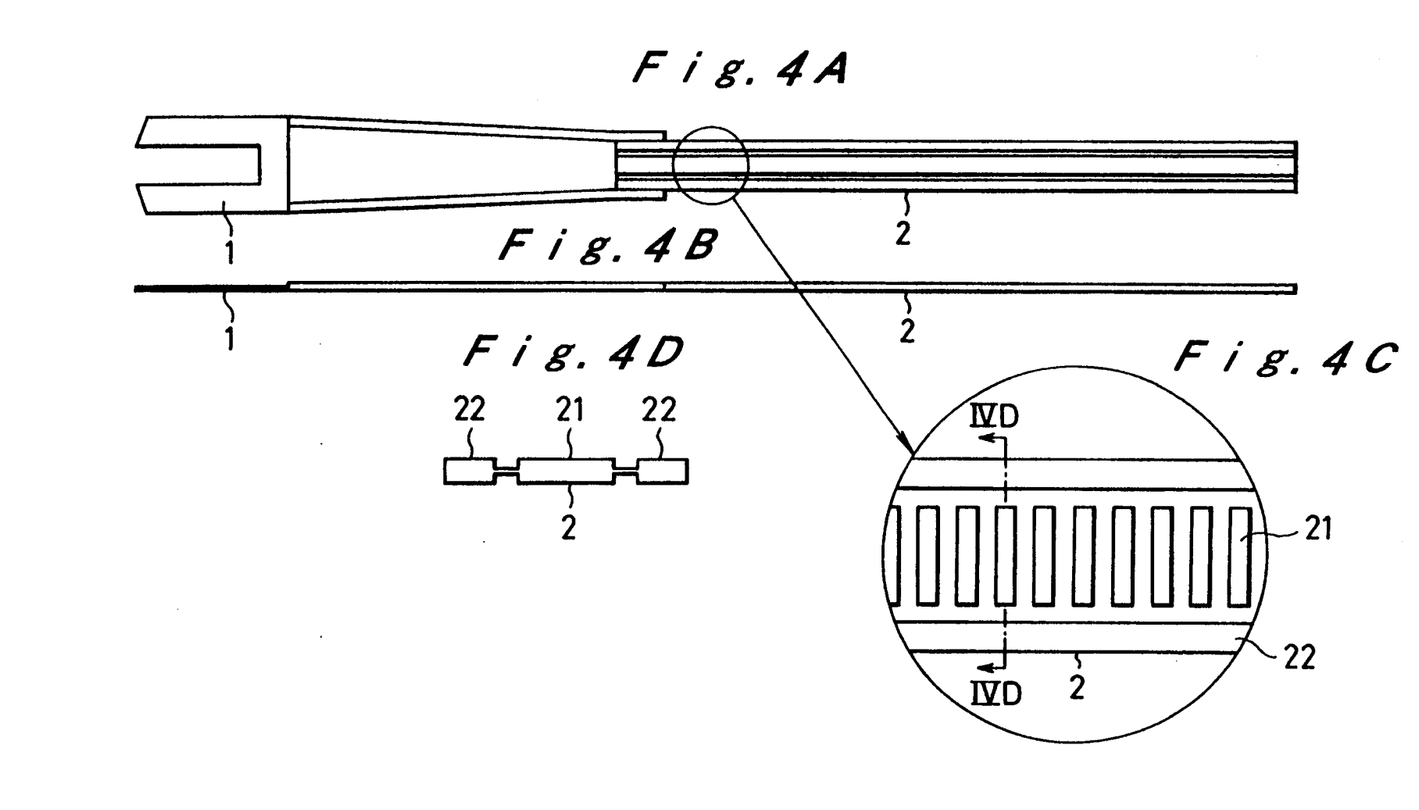
FIG. 4A is a plan view of a robot arm of the robot shown in FIG. 2.
FIG. 4B is a side elevational view of the robot arm.
FIG. 4C is an enlarged fragmentary plan view of a portion of the robot arm.
FIG. 4D is a cross-sectional view taken along line IVD—IVD of FIG. 4C.

FIGS. 4A through 4D show in detail the robot arm 2 of the robot illustrated in FIG. 2. The hand 1 for carrying the semiconductor wafer 11 is in the form of a thin plate of aluminum, and the robot arm 2 is made of a magnetic material of high magnetic permeability. As shown at an enlarged scale in FIGS. 4C, the robot arm 2 has a series of magnetic teeth 21, which are made of magnetic material, located centrally thereon and spaced at a constant pitch. The linear actuator 3 has a horizontal array of electromagnets disposed in confronting relationship to the magnetic teeth 21. When the electromagnets of the linear actuator 3 are successively energized, the robot arm 2 is linearly moved along its axis in a horizontal plane as a linear pulse motor. As shown in FIG. 4D, the robot arm 2 has a pair of thick strips 22 disposed one on each side of the series of magnetic teeth 21. The thick strips 22 are magnetically held by the magnetic bearings, i.e., held out of mechanical contact with the casing 9 of the linear actuator 2 vertically and horizontally under magnetic forces produced by the horizontal array of magnets of the linear actuator 2.

Figure 5:
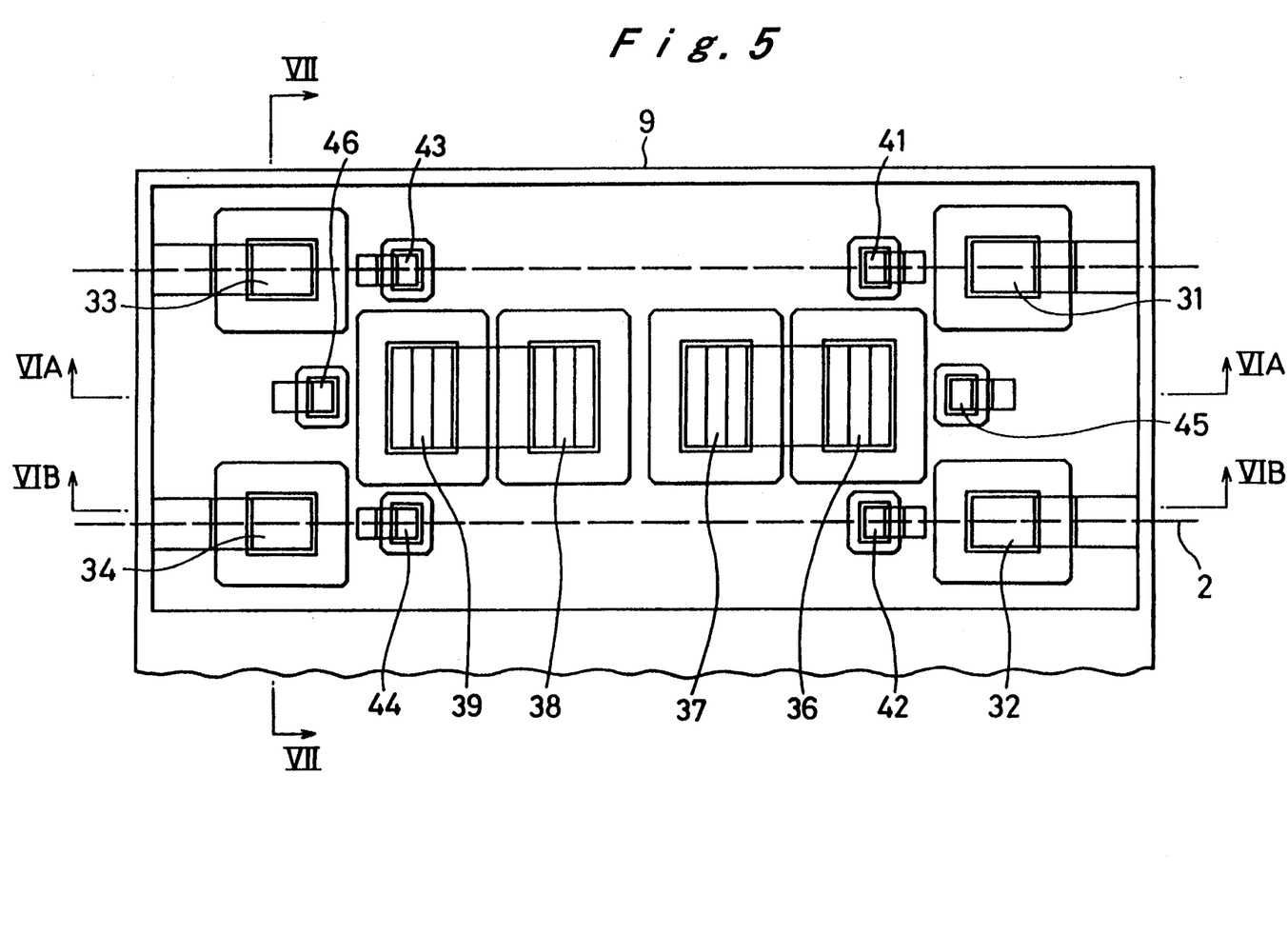
FIG. 5 is a plan view of a linear actuator of the robot.

FIG. 5 shows the linear actuator 3 in detail. The linear actuator 3 has electromagnets 31, 32, 33, 34, 36, 37, 38, 39 that are arranged in a horizontal array and hermetically housed in the casing 9. These electromagnets 31, 32, 33, 34, 36, 37, 38, 39 magnetically hold the robot arm 2 through the casing 9 out of mechanical contact therewith. When the electromagnets 36, 37, 38, 39 are energized, they magnetically actuate the robot arm 2 horizontally along its axis. The thick strips 22 of the robot arm 2 are held vertically and horizontally out of mechanical contact with the casing 9 under magnetic attractive forces produced by the electromagnets 31, 32, 33, 34. The linear actuator 3 also has magnetic bearing position sensors 41, 42, 43, 44 for detecting vertical and horizontal positions of the robot arm 2 when it is supported under magnetic forces generated by the electromagnets 31, 32, 33, 34. The electromagnets 36, 37, 38, 39 are horizontally arrayed as part of the linear pulse motor of the linear actuator 3. The magnetic teeth 21 on the center of the robot arm 2 are propelled magnetically when the electromagnets 36, 37, 38, 39 are successively energized by pulsed currents. The linear actuator 3 further includes linear pulse motor position sensors 45, 46 for detecting the magnetic teeth 21 to determine timing to energize the electromagnets 36, 37, 38, 39 with pulsed currents.

Figure 6A:
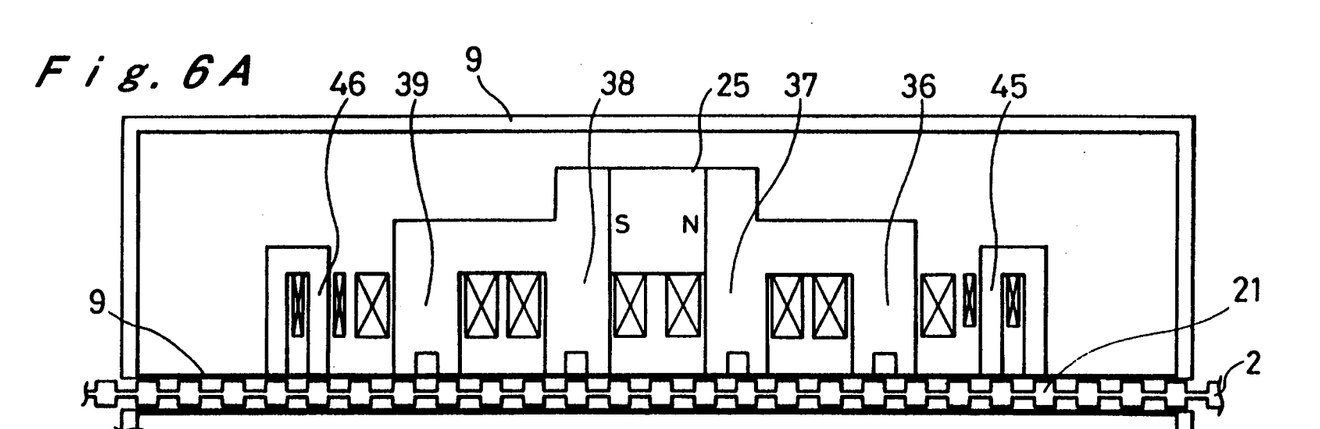
FIG. 6A is a cross-sectional view taken along line VIA—VIA of FIG. 5.

As shown in FIG. 6A, a combination of the electromagnets and a permanent-magnet of the linear actuator 3 are housed in the casing 9 and horizontally arrayed. The electromagnets 36, 37, 38, 39 and a permanent magnet 25 jointly serve as a linear pulse motor for linearly moving the robot arm 2 in its longitudinal direction. More specifically, the permanent magnet 25 generates a bias flux, and the yokes of the electromagnets 36, 37, 38, 39 apply fluxes of different intensities to the magnetic teeth 21 of the robot arm 2. For example, when the electromagnet 36 is energized relatively strongly by a pulsed current, the yoke thereof produces a relatively strong magnetic force, magnetically attracting a near magnetic tooth 21 of the robot arm 2 thereby to move the robot arm 2. When the attracted magnetic tooth 21 comes to a position immediately underneath the yoke of the electromagnet 36, another magnetic tooth 21 of the robot arm 2 is displaced out of alignment with the yoke of the electromagnet 38 by ½ of the pitch of the magnetic teeth 21. Therefore, upon energization of the electromagnet 38 with a pulsed current, the yoke thereof magnetically attracts the other magnetic tooth 21, thereby moving the robot arm 2. In this manner, the electromagnets 36, 37, 38, 39 are successively energized to linearly move the robot arm 2 horizontally along its axis.

Figure 6B:
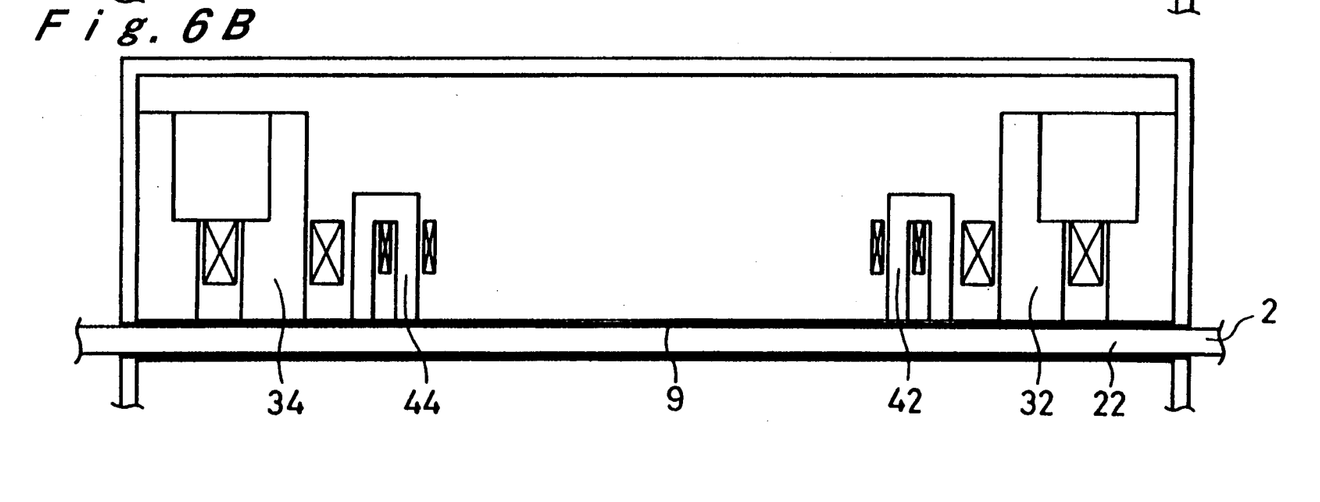
FIG. 6B is a cross-sectional view taken along line VIB—VIB of FIG. 5.

As shown in FIG. 6B, the electromagnets 32, 34 magnetically lift the thick strips 22 of the robot arm 2 out of mechanical contact with the casing 9 and hold them in a certain horizontal plane. The magnetic bearing position sensors 42, 44 shown in FIG. 6B comprise electromagnetic-induction-type sensors for detecting the positions of the thick strips 22 to control currents that energize the electromagnets 32, 34, i.e., magnetic attractive forces produced thereby, for elevating the robot arm 2 out of mechanical contact with the casing 9.

Figure 7:
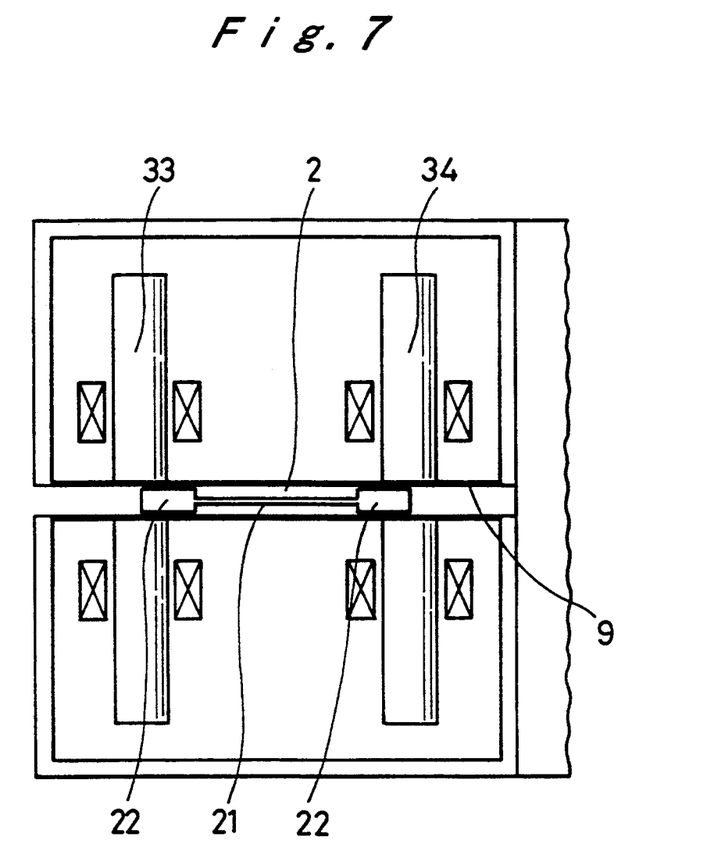
FIG. 7 is a cross-sectional view taken along line VII—VII of FIG. 5.

As illustrated in FIG. 7, the electromagnets 33, 34 produce magnetic attractive forces to magnetically lift the thick strips 22 of the robot arm 2 out of mechanical contact with the casing 9. The thick strips 22 have outer edges positioned substantially at the centers of the electromagnets 33, 34, respectively, for supporting the robot arm 2 horizontally substantially intermediate between the yokes of the electromagnets 33, 34 due to magnetic shearing forces at the outer edges of the thick strips 22.

Figure 8:
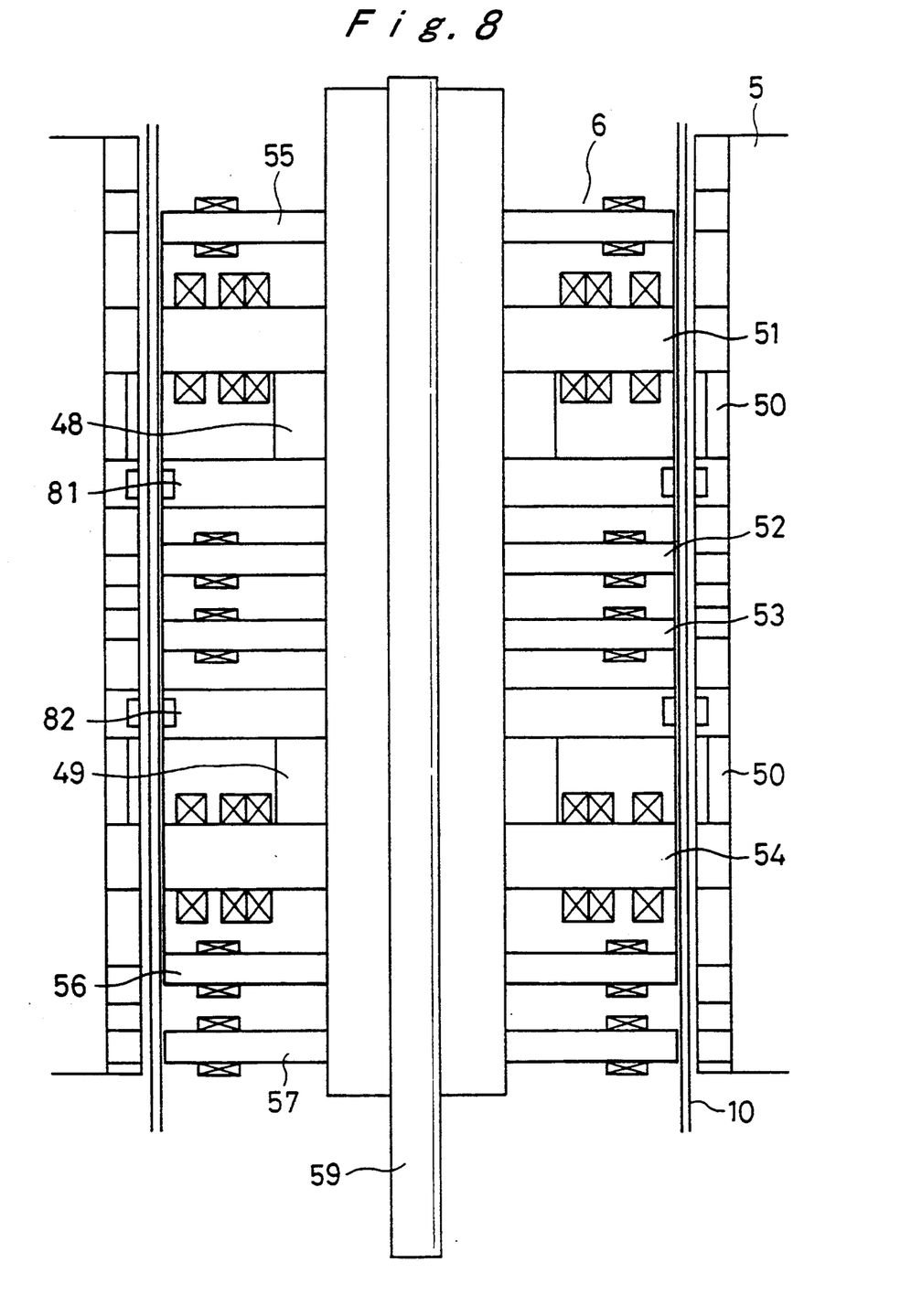
FIG. 8 is a vertical cross-sectional view of a rotary actuator and an outer rotor of the robot.

FIG. 8 shows the rotary actuator 6 and the outer rotor 5 at an enlarged scale. The rotary actuator 6 has electromagnets and other components that are arranged in a cylindrical pattern and hermetically housed in the casing 10. More specifically, the rotary actuator 6 comprise magnetic thrust bearings 81, 82, permanent magnets 48, 49, braking electromagnets 52, 53, and electromagnets 51, 54 serving as magnetic radial bearings and a stepping motor. These components of the rotary actuator 6 are arranged in a cylindrical array in the casing 10. The outer rotor 5 with magnetic poles on its inner circumferential wall is disposed around the casing 10 and magnetically held out of mechanical contact therewith for rotation. The permanent magnets 48, 49, which are of a cylindrical shape, provide magnetic circuits that pass from the yokes of the magnetic thrust bearings 81, 82 through gaps thereof and magnetic bodies 50 on the inner circumferential wall of the outer rotor 5 to the yokes of the electromagnets 51, 54. The outer rotor 5 is held in an axial direction by magnetic shearing forces generated across the gaps of the magnetic thrust bearings 81, 82. Since the magnetic thrust bearings 81, 82 are not effective to dampen vibrations of the outer rotor 5 in the axial direction, the braking electromagnets 52, 53 are provided to dampen such vibrations for positioning of the outer rotor 5 in the axial direction.

As described above, the electromagnets 51, 54 serve as both a rotary stepping motor and magnetic radial bearings. The electromagnets 51, 54 have radial magnetic poles with teeth on their distal ends, and the magnetic bodies 50 of the outer rotor 5 also have magnetic teeth on their surfaces confronting the radial magnetic poles of the electromagnets 51, 54. The radial magnetic poles of the electromagnets 51, 54 and the magnetic bodies 50 of the outer rotor 5 jointly provide magnetic circuits which form the magnetic radial bearings under magnetic attractive force that are generated when the coils of the electromagnets 51, 54 are energized. The teeth on the distal ends of the radial magnetic poles of the electromagnets 51, 54 and the teeth of the magnetic bodies 50 of the outer rotor 5 have different pitches so that when the radial magnetic poles of the electromagnets 51, 54 are selectively successively magnetized by pulsed currents supplied thereto, the outer rotor 5 is rotated around the rotary actuator 6 which serves as a stator.

The rotary actuator 6 also includes axial/radial position sensors 55, 56 for detecting the positions of the outer rotor 5 in axial and radial directions. Signals indicating the detected positions of the outer rotor 5 are fed back to the electromagnets 51, 52, 53, 54 to support the outer rotor 5 in a predetermined position around the central axis of the rotary actuator 6. The rotary actuator 6 also has an angular displacement sensor 57 for detecting the angular positions of the teeth of the magnetic bodies 50 on the inner circumferential wall of the outer rotor 5. Based on the detected positions, the electromagnets 51, 54 are successively energized with suitable timing for rotating the outer rotor 5 around the casing 10.

The screw shaft assembly of the vertical actuator 7 for vertically moving the rotary actuator 6 comprises a vertical screw shaft 59 positioned centrally in and threaded through the rotary actuator 6. When the screw shaft 59 is rotated about its own axis, the rotary actuator 6 is vertically moved, and so are the outer rotor 5 magnetically held around the rotary actuator 6 and the linear actuator 3 fixed to the outer rotor 5. Since the screw shaft 59 is hermetically enclosed in the casing 10, it does not contaminate the highly clean space around the robot.

Figure 9:
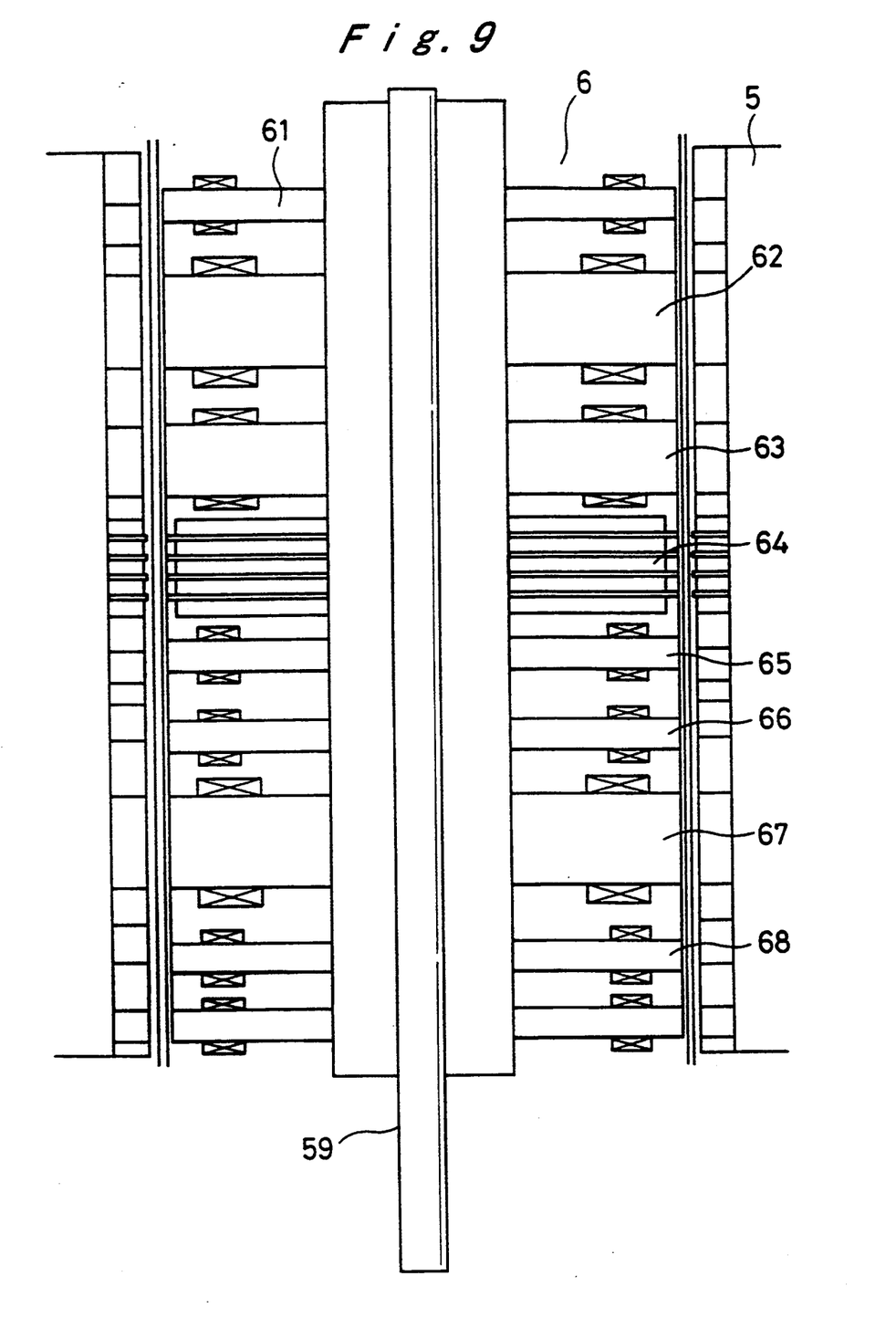
FIG. 9 is a vertical cross-sectional view of a rotary actuator according to still another embodiment of the present invention.

FIG. 9 shows a rotary actuator 6 according to still another embodiment of the present invention. The rotary actuator 6 shown in FIG. 9 includes magnetic radial bearings, a magnetic thrust bearing, and a rotary stepping motor that are arranged in a cylindrical pattern. An outer rotor 5 having magnetic bodies on its inner circumferential wall is rotatably disposed around the rotary actuator 6 out of mechanical contact therewith. The rotary actuator 6 is vertically movable on and along a vertical screw shaft 59. The rotary actuator 6 specifically comprises a radial/axial sensor 61, a magnetic radial bearing 62, a rotary stepping motor 63, a passive magnetic thrust bearing 64, brakes 65, 66, a magnetic radial bearing 67, a radial/axial sensor 68, and an angular displacement sensor 69, which are successively arranged downwardly in the order named in FIG. 9.

Figure 10:
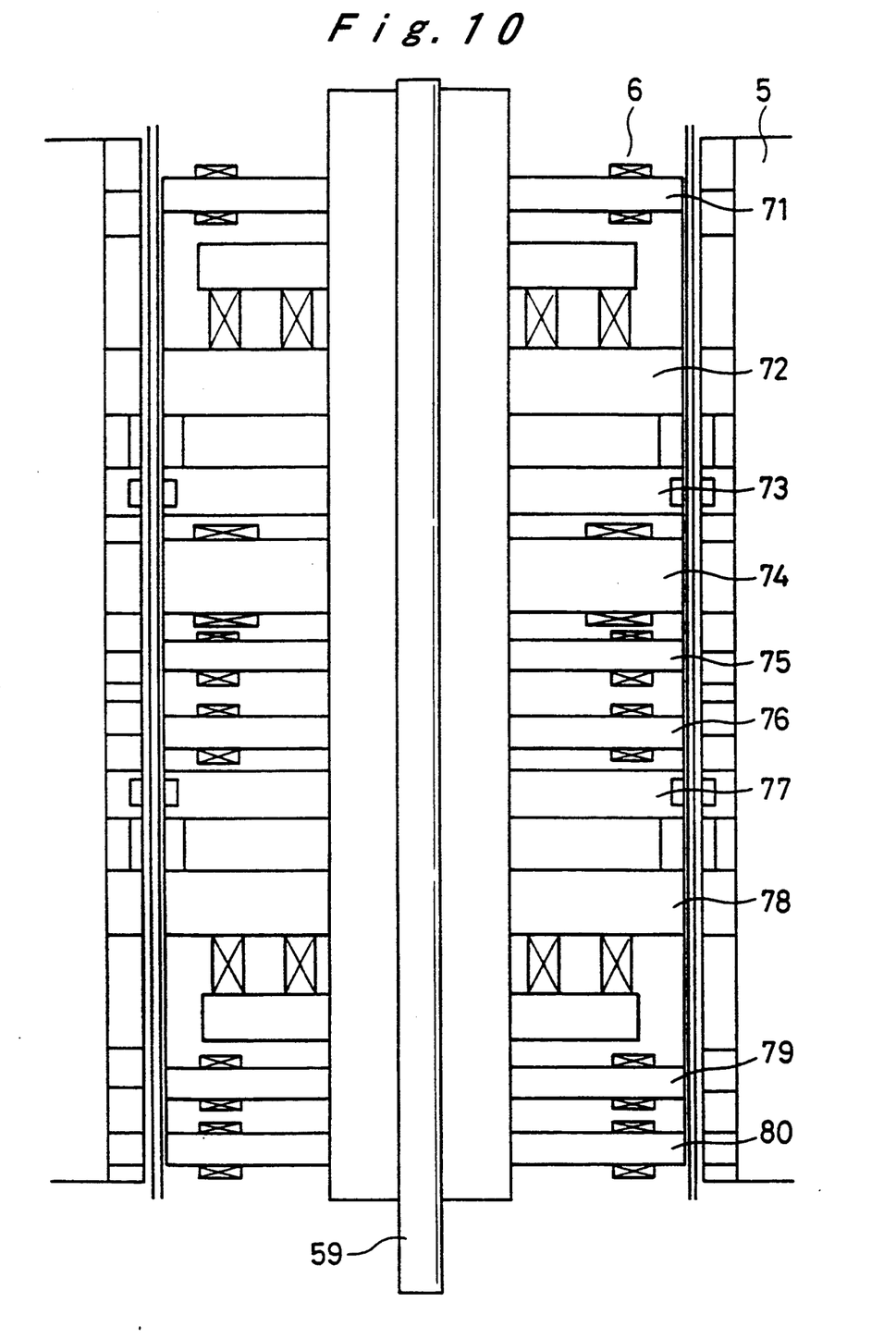
FIG. 10 is a vertical cross-sectional view of a rotary actuator according to a further embodiment of the present invention.

FIG. 10 shows a rotary actuator 6 according to a further embodiment of the present invention. The rotary actuator 6 shown in FIG. 10 also includes components that are arranged in a cylindrical pattern, and an outer rotor 5 is rotatably disposed around the rotary actuator 6 out of mechanical contact therewith. The rotary actuator 6, which is composed of a cylindrical assembly of electromagnets or permanent magnets, is vertically movable on and along a vertical screw shaft 59. The rotary actuator 6 specifically comprises a radial/axial sensor 71, a magnetic radial bearing 72, a passive magnetic thrust bearing 73, a rotary stepping motor 74, brakes 75, 76, a passive magnetic thrust bearing 77, a magnetic radial bearing 78, a radial/thrust sensor 79, and an angular displacement sensor 80, which are successively arranged downwardly in the order named in FIG. 10.

Figure 11:
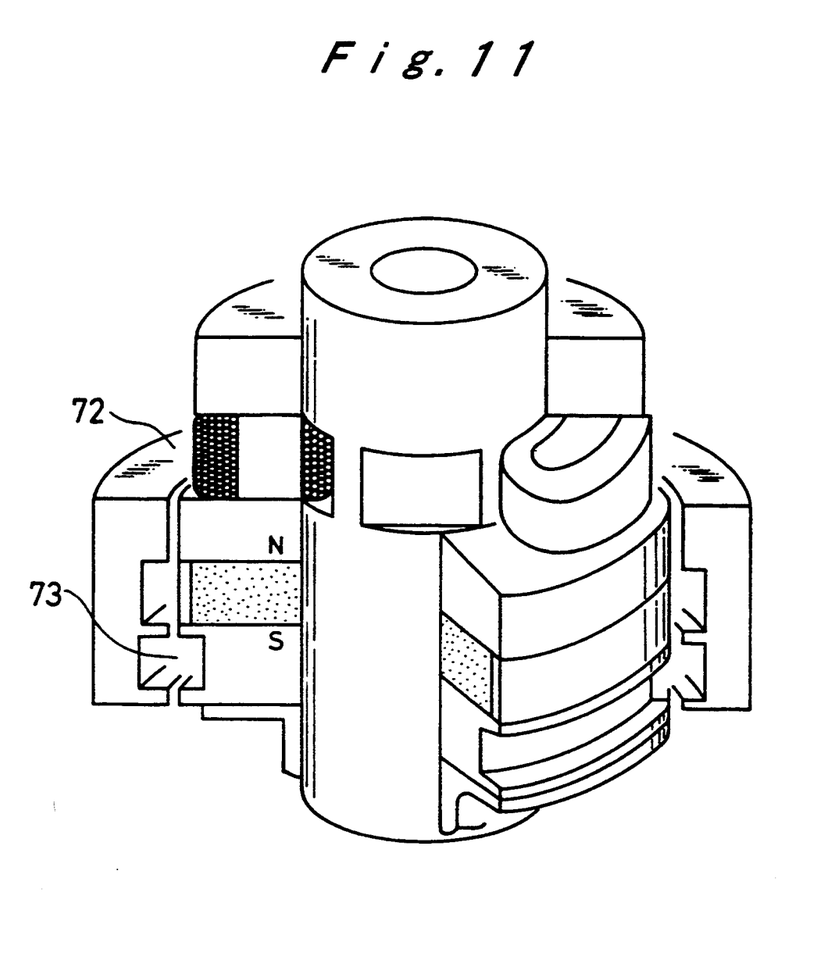
FIG. 11 is a perspective view, partly cut away, of a magnetic radial bearing and a magnetic thrust bearing of the rotary actuator shown in FIG. 10.
Figure 12:
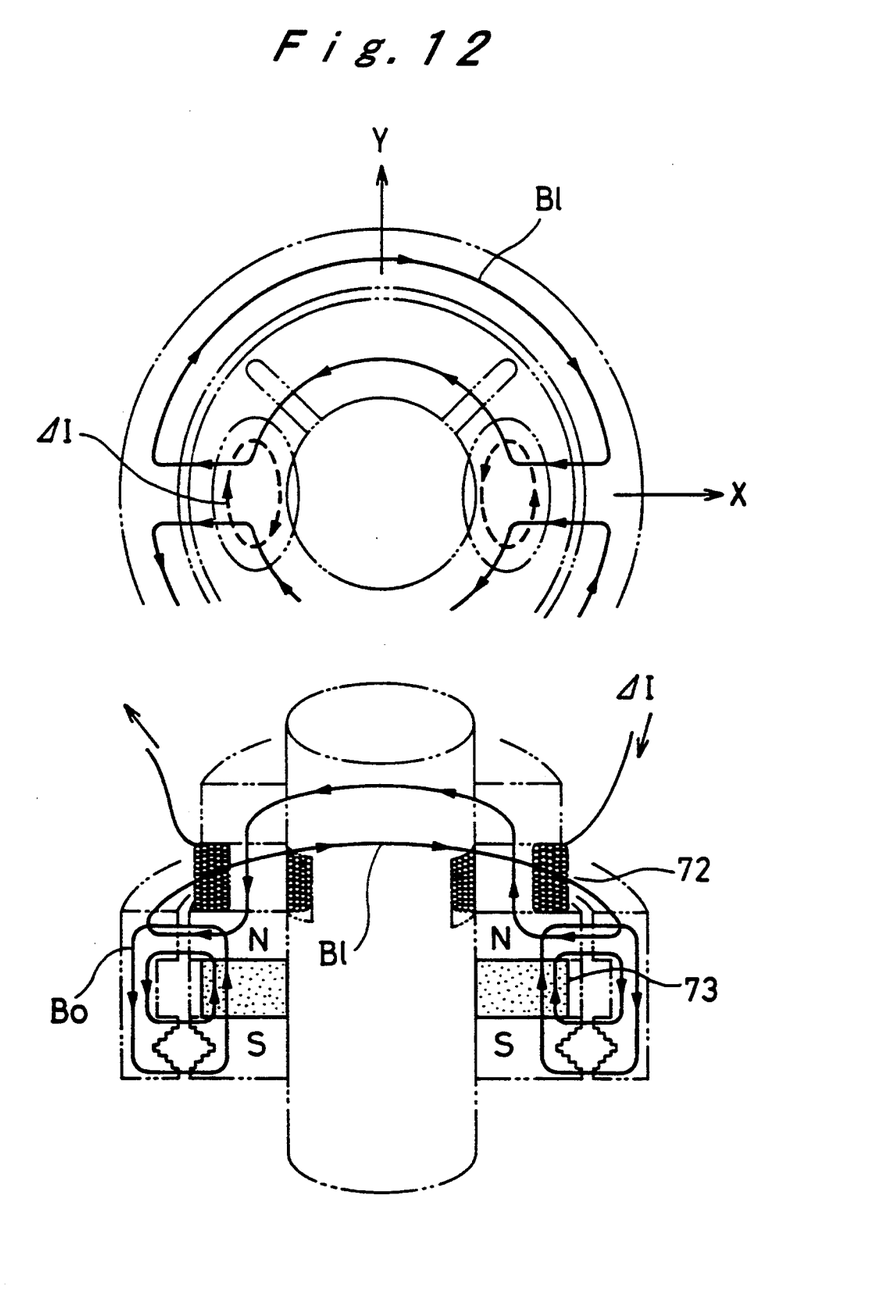
FIG. 12 is a diagram showing magnetic fluxes and electric currents in the magnetic radial bearing and the magnetic thrust bearing of the rotary actuator shown in FIG. 10.

The rotary actuator 6 shown in FIG. 10 is disclosed in detail in Japanese patent application No. 63-206890. The magnetic radial bearing 72 and the passive magnetic thrust bearing 73 are of an integral assembly as shown in FIG. 11. Magnetic fluxes and electric currents flowing in the integral assembly shown in FIG. 11 are illustrated in FIG. 12. As shown in FIG. 12, magnetic fluxes Bo generated by an annular permanent magnet are used as magnetic fluxes for the passive magnetic thrust bearing 73 and also bias magnetic fluxes for the magnetic radial bearing 72. Radial magnetic attractive forces are controlled by magnetic fluxes B1 generated by an electric current $D_I$ flowing through the electromagnet. The rotary actuator 6 of the above structure does not require thrust discs which would otherwise be dedicated to the magnetic thrust bearings. The integral assembly of the magnetic radial and thrust bearings is relatively simple in construction.

As described above, the robot arm of a robot according to the present invention is linearly movable by a combination of magnetic bearings and a linear pulse motor, and rotatable by a combination of magnetic bearings and a stepping motor for highly accurately positioning a workpiece carried by the hand on the robot arm. The linear actuator, the rotary actuator, and the vertical actuator are hermetically housed in the casings. Therefore, the actuators for moving the robot arms have no mechanically contacting components, so that they do not produce dust particles and are not required to be lubricated. The robot is thus prevented from contaminating the environment in which it operates, and is also maintenance-free. Consequently, the robot is suitable for use in special environments such as semiconductor manufacturing processes which require highly clean ambient space.

Although certain preferred embodiments of the present invention have been shown and described in detail, it should be understood that various changes and modifications may be made therein without departing from the scope of the appended claims. Especially it should be noted that the robot arm of the robot is not only movable in a horizontal plane but is also movable in an inclined plane.

What is claimed is:

1. A robot comprising:
   a robot arm comprising a hand for carrying a workpiece and an extending portion connected to the hand;
   a linear actuator for receiving said extending portion of the robot arm and comprising magnetic bearings for magnetically holding said extending portion of said robot arm without mechanical contact, and a linear motor for moving said extending portion of said robot arm linearly without mechanical contact; and
   a rotary actuator including magnetic bearings for magnetically holding a magnetic body supporting said linear actuator without mechanical contact, and a rotary motor for rotating said magnetic body around said rotary actuator without mechanical contact.

2. A robot according to claim 1, further comprising:
   a first casing hermetically housing said magnetic bearings and said rotary motor of said rotary actuator;
   a second casing hermetically housing said magnetic bearings and said linear motor of said linear actuator; and
   a vertical actuator for vertically moving said magnetic bearings and said rotary motor of said rotary actuator, said vertical actuator being housed in said first casing.

3. A robot according to either one of claims 1 or 2, wherein said linear actuator comprises:
   a combination of permanent-magnetics and electromagnets for said magnetic bearings;
   a combination of permanent-magnetics and electromagnets for said linear motor;
   horizontal/vertical position sensors for said magnetic bearings for detecting a position of said robot arm in a horizontal and vertical direction; and
   a linear displacement sensor for said linear motor for detecting a position of said robot arm in a moving direction.

4. A robot according to either one of claims 1 and 2, wherein said rotary actuator comprises:
   a combination of permanent-magnets and electromagnets for said magnetic bearings;
   a combination of permanent-magnets and electromagnets for said rotary motor;
   axial/radial position sensors for the said magnetic bearings for detecting positions of said magnetic body in axial and radial directions; and
   a displacement sensor for said rotary motor for detecting an angular position of said magnetic body.

5. A robot according to either one of claims 1 or 2, wherein said rotary actuator comprises electromagnets for damping vibrations of said magnetic body and positioning said magnetic body in an axial direction.

6. A robot according to claim 4, wherein said rotary actuator comprises electromagnets for damping vibrations of said magnetic body and positioning said magnetic body in an axial direction.

* * * * *